(12) United States Patent
Wiener et al.

(10) Patent No.: US 11,097,913 B2
(45) Date of Patent: Aug. 24, 2021

(54) TRANSPORT ROLLER

(71) Applicant: Atotech Deutschland GmbH, Berlin (DE)

(72) Inventors: Ferdinand Wiener, Berlin (DE); Stefan Grüßner, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 291 days.

(21) Appl. No.: 16/345,747

(22) PCT Filed: Sep. 21, 2017

(86) PCT No.: PCT/EP2017/073933
§ 371 (c)(1),
(2) Date: Apr. 29, 2019

(87) PCT Pub. No.: WO2018/091174
PCT Pub. Date: May 24, 2018

(65) Prior Publication Data
US 2020/0055684 A1    Feb. 20, 2020

(30) Foreign Application Priority Data

Nov. 16, 2016    (EP) ..................................... 16199129

(51) Int. Cl.
*B65H 5/06*    (2006.01)
*H01L 21/67*    (2006.01)
(Continued)

(52) U.S. Cl.
CPC ....... *B65H 5/062* (2013.01); *H01L 21/67034* (2013.01); *H05K 3/0085* (2013.01);
(Continued)

(58) Field of Classification Search
CPC ...... B65H 5/062; H05K 3/0085; H05K 3/002; H05K 3/06; H05K 2203/0143;
(Continued)

(56) References Cited

U.S. PATENT DOCUMENTS 6,012,193 A    1/2000    Inoue et al.
6,588,043 B1    7/2003    Frost et al.
(Continued)

FOREIGN PATENT DOCUMENTS

| DE | 102007061581 | 6/2009 | | |
|---|---|---|---|---|
| EP | 0993023 | 4/2000 | | |
| EP | 2886685 A1 * | 6/2015 | ............. | C25D 21/12 |

OTHER PUBLICATIONS

PCT/EP2017/073933; PCT International Search Report and Written Opinion of the International Searching Authority dated Dec. 12, 2017.

*Primary Examiner* — Sophia S Chen
(74) *Attorney, Agent, or Firm* — Renner, Otto, Boisselle & Sklar, LLP

(57) ABSTRACT

The present invention refers to a new type of transport roller providing a modified surface to provide improved transport properties for new substrates. Furthermore, it refers to horizontal transport systems beneficially utilizing such transport rollers, especially for providing retaining roller pairs. Additionally, the present invention refers to a treatment device containing such transport roller or horizontal transport system. Furthermore, it refers to a method for treating a substrate and the use of such transport roller.

21 Claims, 5 Drawing Sheets

(51) Int. Cl.
*H05K 3/00* (2006.01)
*H05K 3/06* (2006.01)

(52) U.S. Cl.
CPC ............... *H05K 3/002* (2013.01); *H05K 3/06* (2013.01); *H05K 2203/0143* (2013.01)

(58) Field of Classification Search
CPC ............. H01L 21/677; H01L 21/67034; H01L 21/67046; H01L 21/67051; H01L 21/67057; H01L 21/67706; H01L 21/6776
See application file for complete search history.

(56) References Cited

U.S. PATENT DOCUMENTS

| | | | |
|---|---|---|---|
| 2012/0048678 A1* | 3/2012 | Itoh .................... | B65G 13/10 198/577 |
| 2012/0140012 A1* | 6/2012 | Saito .................... | B65H 5/062 347/104 |
| 2017/0072427 A1 | 3/2017 | Landa et al. | |
| 2019/0122914 A1* | 4/2019 | Eckstein ........... | H01L 21/67057 |

\* cited by examiner

TRANSPORT ROLLER

The present application is a U.S. National Stage Application based on and claiming benefit and priority under 35 U.S.C. § 371 of International Application No. PCT/EP2017/073933, filed 21 Sep. 2017, which in turn claims benefit of and priority to European Application No. 16199129.4 filed 16 Nov. 2016, the entirety of both of which is hereby incorporated herein by reference.

FIELD OF THE INVENTION

The present invention refers to a type of transport roller providing an improved transport behavior especially with regard to very sensitive substrates and their use. Furthermore, the present invention refers to a method of treating such substrates using such an inventive transport roller for transporting the substrate.

BACKGROUND OF THE INVENTION

Transport rollers are known in the art beneficially used in means for horizontally transporting a substrate. They are very useful, as they represent a very efficient way of transporting. Furthermore, they typically allow transporting a substrate horizontally without the need of clamps or other devices possibly damaging a substrate. Such devices proved to be, for example, especially useful to transport substrates like printed circuit boards through different treatment zones of a treatment device. However, new types of substrates being, for example more flexible, result in new problems. Herein, it appears that more flexible substrates at least slightly bend, for example, based on adhesion effects while passing transport rollers resulting in minor damages on the surface. Neither transport rollers as commonly used providing a solid body nor wheel axis providing a central rod, wherein a plurality of discs are arranged spaced apart on said central rod, provided suitable results in this contexts.

A special problem to be solved is processing new types of substrates providing an especially sensitive surface. Especially, it proved to be problematic to process such substrates in a horizontal treatment device providing retaining roller pairs to retain a treatment liquid in a certain area of the device. Such arrangement typically provides a higher stress on the substrates as, for example, the weight of the upper roller in typical arrangements presses down onto the substrate. While some substrates of the present time seem to suffer essentially no damage, especially, test models of new generations of substrates providing very fine structures upon their surface provide a highly increased sensitivity and show damages after treatment. It is expected that such kind of substrates comprising a more sensitive surface will become an essential part of the modern products. Thereby, the general requirements for transport system are also conclusively expected to highly increase to enable the treatment of such kind of next generation substrates.

OBJECTIVE OF THE PRESENT INVENTION

Thus, it is an objective of the present invention to provide a new type of transport roller providing improved characteristics for future challenges in the treatment of substrates. Preferably, such transport rollers ideally also enable a more sensible treatment of substrates while said substrates are transported through a retaining roller pair providing such transport rollers.

SUMMARY OF THE INVENTION

The aforementioned problems are solved by the invention as disclosed in the independent and dependent claims and the description. Further objects and additional benefits are included in the following description, however, even further objects not being explicitly stated herein but being immediately derivable or discernible from the connections discussed herein are solved by the present invention and its embodiments disclosed herein.

The present invention refers to a transport roller for horizontal transport systems for transporting a substrate, wherein the transport roller essentially has the form of a solid body roller characterized in that the transport roller further contains a modified surface providing non-uniform contacting of the substrate, wherein the modified surface contains contact areas for contacting the substrate and recesses between the contact areas not contacting the substrate, wherein the modified surface is adapted to provide a liquid or gas exchange on both sides of the transport roller while being transported using the transport roller; wherein the modified surface consists of an essentially homogenous material like a polymer or a metal, wherein said homogenous material is not made from a fibrous material or a foam.

The phrase "transport roller" according to the present invention refers to rollers adapted to at least partially coming into contact with the substrate. For example, this term refers to rollers arranged below and above the transport plane, which are coming into contact with the substrate while forwarding said substrate thereby.

The phrase "modified surface" refers to the surface of the transport roller providing said contact areas and recesses. Typically, said modified surface at least extends over the surface of the transport roller adapted to contact the substrate. As such substrate is typically far smaller than the transport roller and multiple transport paths are possible a single substrate typically does not come into contact with the whole surface adapted to contact the substrate of the transport roller. However, such modified surface not necessarily covers the whole surface of the transport roller, as such transport rollers preferably provide a safety area at its ends not intended to contact the substrate during normal transport. Limiting the modified surface to the required surface area becomes more interesting the more complex the modified surface becomes.

Furthermore, the present invention refers to a horizontal transport system containing transport rollers, wherein at least one transport rollers is an inventive transport roller.

Furthermore, the present invention refers to a treatment device for wet treatment, like chemical etching, chemical cleaning, chemical metal deposition or electrolytic metal deposition, in particular, chemical metal deposition or electrolytic metal deposition, wherein the treatment device contains at least one inventive transport roller or at least one inventive horizontal transport system.

Furthermore, the present invention refers to a method for treating a substrate, wherein the method contains the step of transporting the substrate using an inventive transport roller, an inventive horizontal transport system or an inventive treatment device.

Furthermore, the present invention refers to the use of an inventive transport roller for horizontally transporting a substrate.

BRIEF DESCRIPTION OF THE FIGURES

For a more complete understanding of the present invention, reference is made to the following Detailed Description of the Invention considered in conjunction with the accompanying figures, in which.

DETAILED DESCRIPTION OF THE INVENTION

Figure 1:
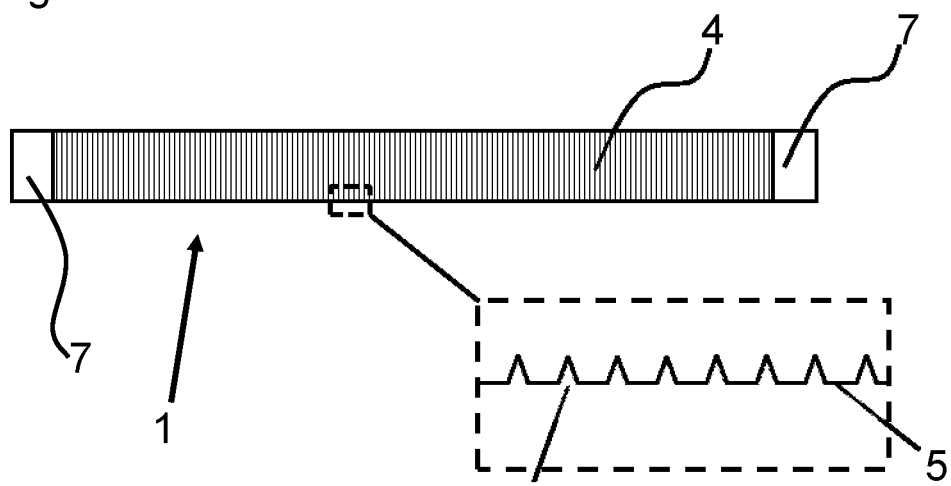
FIG. 1 shows a schematic side view of an inventive transport roller according to a preferred embodiment of the present invention.

The present invention refers to a transport roller for horizontal transport systems for transporting a substrate, wherein the transport roller essentially has the form of a solid body roller characterized in that the transport roller further contains a modified surface providing non-uniform contacting of the substrate, wherein the modified surface contains contact areas for contacting the substrate and recesses between the contact areas not contacting the substrate, wherein the modified surface is adapted to provide a liquid or gas exchange on both sides of the transport roller while being transported using the transport roller; wherein the modified surface consists of an essentially homogenous material like a polymer or a metal, wherein said homogenous material is not made from a fibrous material or a foam.

While testing examples of possible new substrates it was noted that very flexible substrates, for example, tend to suffer from being transported through an essentially dry module using state of the art full body rollers as long as the substrates are still in a wet state. Herein, it is suspected that the damages occurring are based on temporary deformations of the substrate resulting from, for example, an adhesion of the substrate to the transport roller. It is assumed that the fine structures of the modified surface of the transport roller collect small amounts of liquid leveling out a liquid film building up on the surface of the substrate resulting from drops of liquid adhering to the substrate. In case such liquid film is endangered to be interrupted the small structures of the inventive modified surfaces allow a limited liquid exchange on both sides of the transport roller to level out parts of the substrate being drier. Such equalization of the liquid film seems to minimize physical stress on the substrate as interruptions of the liquid film providing uncontrolled movement of the substrate are minimized.

Furthermore, it appears that the inventive transport rollers are also beneficially used in drying modules, as the more homogenous liquid film provides a higher surface area and, thus, increases the drying speed of liquid adhering to the substrate. Also, directing a slow gas stream towards a substrate only providing a low amount of liquid on its surface seems to provide an air cushion to gently detach the substrate from the transport roller. It is assumed that a flapping of the substrate is highly reduced or typically even prevented because the gas forwarded towards the transported is not trapped until the resulting pressure is high enough to lift up the substrate. On the contrary the recesses of the inventive modified surface seem to channel and enable a continuous gas stream. Therefore, the inventive transport roller may be used, for example, to automatically equalize the liquid film of the substrate until it is dried enough and thereafter are beneficially used to enhance the drying effect of a drying module.

Furthermore, the inventive transport rollers providing small recesses proved to be especially useful in case a sensitive side of the substrates is pressed onto the surface of the transport roller. If, for example, a liquid is retained on a side opposite to the transport direction of the substrate the movement of the transport roller forwards the liquid stream towards the bottleneck of the substrate and the transport roller as it can be seen in, for example, FIG. 2. Herein, it is assumed that the combination of liquid movement and the narrowing of the gap between the substrate and the transport roller provide an increased pressure near the contact point of substrate and transport roller. Said increased pressure, however, seems to damage the fine structure of sensitive substrates. The inventive transport rollers provide a defined small liquid exchange of both sides of the transport roller to reduce such local pressure peaks. Furthermore, using a large number of small contact areas as disclosed herein provides a very well distribution of the pressure resulting from the weight of the upper transport roller of such retaining roller pair pressing down onto the substrate.

The phrase "solid body roller" as used in the present invention refers to a roller, wherein the roller provides an essentially continuous contacting of the substrate transported therewith. Herein, the part of such solid body roller adapted to contact the substrate providing the modified surface preferably essentially has the form of a geometrical body like a cylinder, preferably a circular cylinder. Preferably, such part of the solid body roller has a form, wherein the modified surface deviates less than 1 cm, more preferred less than 0.5 cm, even more preferred less than 0.2 cm, most preferred less than 0.1 cm, from an ideal geometrical body like a cylinder measured perpendicular to the surface of the ideal geometrical body. Herein, such ideal geometrical body, preferably a circular cylinder, is placed to provide the lowest distances from the points of the modified surface to its own surface.

The term "contact line" according to the present invention refers to the virtual line resulting from the contact points of the transported substrates and the surface of the transport roller adapted to be contacted by said substrates having such a modified surface, wherein said contact line is preferably straight or slightly curved, more preferred straight. In case the modified surface of the transport roller is, for example, elastic, the contact area represent the contact points of the modified surface and a substrate, wherein the substrate is pressed down on an inventive transport roller with a weight of 1000 g/m. For example, the substrate is pressed down using another transport roller providing the appropriate weight.

The term "axis" as used herein refers to the geometrical center line going through the middle of the transport roller, wherein the transport roller is adapted to rotate around said axis.

The term "contact body" according to the present invention refers to the three dimensional body resulting from the entirety of the contact lines of the transport roller.

The term "contact circle" according to the present invention refers to the circle resulting from the contact body in a cross section perpendicular to the axis of the transport roller.

The phrase "transport plane" according to the present invention refers to the plane containing the lower surface of the substrate as it is transported. It has to be understood that said transport plane might not be a perfect geometric plane as there might be some height differences along the path of transportation resulting in a corrugation of said transport plane.

It is typically preferred that the modified surface provides line shaped recesses. Herein, it was noted that such recesses typically provide a very good combination of easy production of the modified surface and the ability to provide a liquid or gas exchange on both sides of the transport roller. Lines shaped recesses of various shapes can be used. A preferred type of line shaped recesses are essentially straight, preferably straight, line shaped recesses. Such recesses can be especially easily produced and typically provide a reliable effect. Naturally, for evaluating whether such line shaped recess is straight or not the curvature of the surface of the transport roller is neglected.

However, it can also be preferred to provide, for example, curved line shaped recesses. Such recesses seem to provide an improved effect, for example, if less than 50% of a contact line in a cross section along the axis of the transport roller contacts contact areas.

It was noted that a specific type of shape of the recess often proved to be beneficial. Herein, the recesses preferably at least partly have a shape of crosswise arranged lines. Preferably, at least 50%, more preferred at least 80%, even more preferred at least 95%, of the recesses are line shaped recesses providing such shape of crosswise arranged lines, based on the center lines of the recesses and the surface area of the contact body contacting said recesses.

According to an especially preferred embodiment of the present invention the inventive transport roller provides line shaped recesses, wherein the lines shaped recesses essentially extend perpendicular to a contact line. Especially, it is typically preferred that the modified surface contains at least one recess, more preferred at least ten recesses, even more preferred at least 30 recesses, wherein said recesses provide a line shape, and wherein said line shaped recesses are arranged essentially perpendicular to a contact line. Essentially perpendicular in this context means that the angle between the contact line and the center line of the line shaped recess lies within a range from 80° to 100°, more preferred within a range from 85° to 95°. Such surfaces adapted to contact the substrate typically provide a reliable effect for many purposes, while being easily produced. Corresponding transport rollers have especially proven to be beneficially used in retaining roller pairs.

A further type of line shaped recess typically beneficially utilized takes the shape of a spiral. Herein, the modified surface preferably contains at least one recess, more preferred at least two recesses, even more preferred at least three recesses, most preferred at least seven recesses, wherein said recess(es) provide a line shape, and wherein said line shaped recess(es) provide(s) a spiral/spirals around the transport roller.

Additionally, it is typically preferred that the modified surface provides some symmetry. Herein, the modified surface preferably provides at least one symmetry selected from a symmetry with respect to a line based on the axis of the transport roller, a rotational symmetry based on the axis of the transport roller, a mirror symmetry based on a plane being perpendicular to the axis of the transport roller, a point symmetry based on a point located on the axis of the transport roller, or a symmetry based on a mixture of rotation and translation along the axis of the transport roller. Especially, it is preferred that the surface provides at least a symmetry based on rotational symmetry or a symmetry based on the combination of rotation and translation along the axis of the transport roller. Preferably, the real modified surface only deviates slightly from an ideal body resulting from such symmetry operation. For example, no point of the real modified surface deviates more than 1 mm, more preferred more than 0.2 mm, even more preferred more than 0.05 mm, from the ideal body resulting from the corresponding symmetry operation.

For specific applications it is further preferred that the modified surface contains at least two recesses, wherein the recesses are line shaped, wherein the line shaped recesses intersect providing a point of intersection, and wherein the line shaped recesses form an angle at the point of intersection, and wherein the angle is selected from the range of 60° to 120°, more preferred from the range of 80° to 100°, even more preferred from the range of 85° to 95°. Typically, it is preferred that the modified surface provides at least three, more preferred at least seven, even more preferred at least twelve, of such recess pairs.

For some application it proved to be beneficial that the modified surface provides at least one recess being line shaped, which is essentially parallel to a contact line. The phrase "essentially parallel to a contact line" refers to a line deviating only slightly from a contact line. Preferably, the distance between the middle of the line shaped recess and the contact line is at most 5 mm, more preferred at most 3 mm, even more preferred at most 2 mm.

Additionally, to such line shaped recesses or instead of such line shaped recesses the modified surface can contain at least 50 recesses, more preferred 100 recesses, even more preferred 200 recesses, providing the form of a dot. Herein, said dot shape is based on a side view of the transport roller. Using such recesses provides the benefit that it typically provides a sufficient liquid or gas exchange on both sides of the transport roller during the movement of the transport roller. Simultaneously, the liquid or gas exchange in absence of a rotation of the transport roller is decreased. Thus, such type of recesses proved to be beneficial for certain uses despite being typically more labor intensive than simple line shaped recesses.

Preferably, the inventive modified surface is able to highly reduce the amount of liquid transported along with the substrate. For example, such inventive transport rollers provide a liquid adhering to the substrate through a retaining roller pair containing of an upper transport roller and a lower transport roller, wherein the upper transport roller is an inventive transport roller and the lower transport roller is a solid body transport roller, wherein the liquid transfer is less than 13 times, more preferred less than 10 times, even more preferred less than 4 times of the liquid adhering when transported to an analog retaining roller pair, wherein the upper transport roller and the lower transport roller are solid body transport rollers.

Preferably, a substrate providing a width of 20 inch and a length of 24 inch is used. In case the transport rollers are short the size of the substrate is preferably adjusted to provide a width of the substrate being at most 80%, for example 80%, of the length of the modified surface adapted to contact a substrate, wherein the size ratio of the substrate is maintained. Herein, water is retained on the side of the retaining roller pair contrary to the transport direction of the substrate, wherein the water is accumulated on said pair above the transport plane of the substrate. On the other side the substrate is directly taken from the treatment device and the amount of liquid adhering to the substrate is determined by weighing.

Typically, it is preferred that each recess provides a surface and an area is enclosed between the surface of each recess and a contact line or a contact circle in a cross section, and wherein the areas in a cross section along the axis of the transport roller being at most 5 mm$^2$, the areas in a cross section perpendicular to the axis of the transport roller being at most 12 mm$^2$, or both; more preferred the areas in a cross section along the axis of the transport roller being at most 3 mm$^2$, the areas in a cross section perpendicular to the axis of the transport roller being at most 8 mm$^2$, or both; even more preferred the areas in a cross section along the axis of the transport roller being at most 2 mm$^2$, the areas in a cross section perpendicular to the axis of the transport roller being at most 6 mm$^2$, or both; most preferred the areas in a cross section along the axis of the transport roller being at most 0.5 mm$^2$, the areas in a cross section perpendicular to the axis of the transport roller being at most 1 mm$^2$, or both; add up to at least 90% of the sum of all areas of the recesses in the corresponding cross section. Preferably, the areas of such recesses add up to at least 95%, more preferred at least 99%, of the sum of all areas of the recesses in the corresponding cross section. Even more preferred all recesses of the corresponding cross section provide such areas. It was noted that having even a small amount of very big recesses typically provided a less pronounced inventive effect for many embodiments. For example, in case a liquid should be retained on a side of the transport roller pair or a liquid or gas exchange on both sides of a transport roller pair should be reduced. Herein, a significant number of cross sections are measured.

It was noted that it is typically preferred that the inventive transport rollers provide the aforementioned areas in a cross section along the axis of the transport roller. Such recesses, for example, proved to be especially useful to provide a good reduction of pressure on both sides of a retaining roller pair while reducing the amount of treatment liquid passing a retaining roller pair containing the inventive transport rollers.

For such significant number of cross sections to be measured it is typically, for example, sufficient to measure at least 10, for example 10, preferably at least 50, for example 50, cross sections of 5 cm length selected randomly from the modified surface to provide a reliable measurement. However, the number of cross sections and the length of the tested substrate can, naturally, be increased. For example, if highly irregular modified surfaces are tested it is preferred to take more measurements until a statistically significant result is achieved. For example, at least 100, like 100, more preferred at least 500, like 500, measurements of different cross sections. Unless stated otherwise such significant number of cross sections are measured for the embodiments disclosed herein especially referring to the recesses and contact areas.

Unless specified otherwise an "average" value as used herein refers to the arithmetic mean of said value calculated based on the sum of a certain number of values divided by their number (average value=sum of measured values/number of measured values). To achieve a statistically significant value at least a certain number of values have to be used for calculating said value, for example, at least 10, for example 10, values. The number of measurements, however, can be increased, for example, to at least 50, for example 50, or at least 100, for example 100, if the fluctuation of the values is high.

Furthermore, it was noted that it was typically beneficial using smaller contact areas, as such contact areas seem to provide a further improved inventive effect. Thus, it is typically preferred that most of the contact areas of the modified surface provide a length of at most 0.8 cm in the cross section along the axis of the transport roller; a length of at most 1.3 cm in the cross section perpendicular to the axis of the transport roller, or both; more preferred a length of at most 0.5 cm in the cross section along the axis of the transport roller, a length of at most 1.1 cm in the cross section perpendicular to the axis of the transport roller, or both; even more preferred a length of at most 0.35 cm in the cross section along the axis of the transport roller, a length of at most 0.7 cm in the cross section perpendicular to the axis of the transport roller, or both; even more preferred a length of at most 0.2 cm in the cross section along the axis of the transport roller, a length of at most 0.4 cm in the cross section perpendicular to the axis of the transport roller, or both; based on the length measured along the contact line or the contact circle. Preferably, said lengths refer to at least 90%, more preferred to at least 95%, even more preferred to at least 99% of the contact areas, based on the number of the contact areas in the corresponding cross section. According to specific preferred embodiments all contact areas provide such lengths. Typically, it was especially preferred that the contact areas of the inventive surfaces adapted to contact the substrate provide the aforementioned lengths in the cross section along the axis of the transport roller.

Typically, it was preferred that the modified surface provides a contact body, each recess provides a surface and a point of said surface most distant to the contact body measured perpendicular to the axis of the transport roller, and an area is enclosed between each surface of most recesses and the contact body in a cross section going through said most distant point, wherein said cross section is selected to provide the area being as small as possible and if multiple cross sections provide such area furthermore providing an smallest angle α, wherein the angle α is an angle between said cross section and a plain perpendicular to the axis of the transport roller, wherein said area is at most x+|1.2·x·sin (α)|, wherein x is 3 mm$^2$, preferably 2.1 mm$^2$, more preferred 1.3 mm$^2$. Preferably, at least 90%, more preferred to at least 95%, even more preferred to at least 99%, of the recesses provide such area, based on the number of the recesses providing an depth of at least 0.005 mm, more preferred at least 0.03 mm, in a cross section along the axis of the transport roller, perpendicular to the axis of the transport roller, or both, more preferred along the axis of the transport roller, based on the distance of the surface of the recess to the contact body measured perpendicular to the axis of the transport roller. For example, it was noted that for many embodiments of the present invention it is beneficial to provide line shaped recesses being smaller when essentially extending perpendicular to the contact lines compared to line shaped recesses essentially extending in direction of a contact line.

Additionally, it was noted that for typical applications it is preferred to provide a minimum amount of recesses to enable a liquid or gas exchange on both sides of the transport roller. Herein, it is preferred that an area is enclosed between each recess and a contact line in a cross section along the axis of the transport roller, wherein said areas add together to at least 0.5 mm$^2$ per meter length, more preferred at least 1.2 mm² per meter length, even more preferred at least 2.1 mm² per meter length, even more preferred at least 3.0 mm² per meter length, based on the length of the contact line.

It is further typically preferred that the modified surface provides a contact line, each recess provides a surface and an area is enclosed between the surface of each recess and a contact line in a cross section along the axis of the transport roller, wherein said areas add together to at most 40 mm² per meter length, more preferred at most 30 mm² per meter length, even more preferred at most 26 mm² per meter length, even more preferred at most 21 mm² per meter length, based on the length of the contact line. Furthermore, it can also be preferred that said areas add together to at most 16 mm² per meter length, more preferred at most 12 mm² per meter length, based on the length of the contact line. Such types of rollers proved to be especially useful for transport roller to be used in retaining roller pairs.

It was noted that especially the last mentioned transport rollers cited above proved to be especially useful, for example, for providing transport roller pairs being able to retain a liquid on a side of retaining roller pair or to separate two liquids on both sides of a retaining roller pair. Such transport rollers effectively provide the required pressure equalization for typical applications while preventing an excessive liquid or gas exchange.

Furthermore, it was noted that it typically beneficial to avoid very deep recesses. Thus, it is typically preferred that the modified surface provides a contact line, each recess provides a surface, and the distance between the contact line and the surface of each recess is at most 3.0 mm, preferably at most 1.7 mm, even more preferred at most 0.9 mm, most preferred at most 0.5 mm, measured perpendicular to the axis of the transport roller. It is assumed that too deep recesses tend to provide a less pronounced inventive effect. This seems to be based on the surface tension resulting in the liquid being sucked into the depth of the recess. Such mechanism seems to lead more easily to interruptions of the liquid film, as liquid is sucked away from the surface and is too distant to equalize the liquid film. Also such transport rollers seem to provide decreased retaining effects when being used as part of a retaining roller pair while the pressure equalization does not seem to be improved for typical embodiments.

Typically, it was further preferred to provide a higher number of small contact areas. Herein, the modified surface contains at least one contact area, more preferred at least three contact areas, even more preferred at least four contact areas each cm along the contact line, each two cm along the contact circle, or both, preferably each cm along the contact line. Furthermore, it is often beneficial that said contact areas are separated by recesses providing a depth in a cross section of at least 0.005 mm, preferably at least 0.009 mm, more preferred at least 0.03 mm, even more preferred at least 0.05 mm, measured perpendicular to the axis of the transport roller. Herein, the measurements of the distance are preferably performed each cm starting from the first recess on the modified surface.

Additionally, it was noted that providing a specific shape of the contact areas typically resulted in a further improved beneficial effect. Herein, any contact point of the contact areas provides a distance to the next recess being at most 0.8 cm, preferably at most 0.4 cm, more preferred at most 0.25 cm, even more preferred at most 0.15 cm.

It was further noted that typically reducing the distance between neighboring contact areas proved to be helpful. Herein, it is preferred that neighboring contact areas have a distance of at most 7 mm, more preferred at most 4.3 mm, even more preferred at most 2.3 mm, and wherein neighboring recesses have a distance of at most 6 mm, more preferred at most 4.1 mm, even more preferred at most 2.9 mm. Using such more regular structure of the modified surface typically provided a more reliable effect.

Furthermore, it was typically beneficial to adjust the ratio of the sum of the surface areas of the contact areas and the recesses. Herein, the contact body provides a surface area coming into contact with the contact areas and a surface area not coming into contact with the contact areas, wherein the ratio of the surface area coming into contact with the contact areas to the surface area not coming into contact with the contact areas ranges from 50:1 to 1:50, more preferred from 15:1 to 1:35, even more preferred from 10:1 to 1:30. Typically, such transport roller provide beneficial results when being used for transporting the substrate above said transport rollers or when being used for retaining roller pairs, wherein the upper transport roller provides low weight. However, it can also be preferred that said ratio is selected from 50:1 to 1:30, more preferred from 40:1 to 1:10, even more preferred from 30:1 to 1:1. Such ratios seem to be especially beneficial for transport rollers being used in a retaining roller pair. It is assumed that the observed benefit correlates to the weight distribution and the available contact area to distribute it.

Furthermore, it was noted that providing a specific amount of surface area of the recesses typically proved to be beneficial. Herein, the contact body provides a surface area, wherein a part of said surface area does not come into contact with the contact areas, wherein the surface area not coming into contact with the contact areas ranges from 10% to 95%, preferably from 30% to 80%, more preferred from 35% to 70%, based on the surface area of the contact body. For specific purposes like, for example, utilizing the inventive transport rollers for retaining roller pairs it typically proved to be beneficial that the surface areas not coming into contact with the contact areas ranges from 2% to 50% more preferred from 3.5% to 35%, even more preferred from 4% to 22%.

It was further noted that it is typically preferred to provide a minimum amount of recesses along the contact line. Herein, it is preferred that at most 90%, more preferred at most 83%, even more preferred at most 75%, of a contact line contacts the contacts areas in a cross section along the axis of the transport roller.

Typically, it is also preferred that the recesses provide a certain upper limit of their lengths along the contact line. Herein, it is preferred that parts of the contact line not contacting the contact areas provide a length of at most 1.5 mm, more preferred at most 1.1 mm, even more preferred at most 0.8 mm, in a cross section along the axis of the transport roller. This was especially useful for line shaped recesses extending essentially perpendicular to a contact line.

Typical transport rollers to be provided with the inventive modified surface preferably have a total length of at least 0.9 m, more preferred at least 1.4 m.

The phrase "organic polymer" refers to organic polymeric materials. Said organic polymer can contain fillers, lubricants, plasticizer and further typical additives known in the art. Such additives typically influence the properties of the organic polymer.

Furthermore, it was noted that for typical applications it is not necessarily required to provide the inventive modified surface over the whole length of the transport roller. For example, it can be preferred that the transport roller contains end parts being not adapted to contact the substrate. It was noted that such modified surface can be more sensitive to mechanical stress and, for example, taking such rollers out of the treatment device may result in minor abrasion and, thus, undesired fine particles.

The inventive modified surface can be produced using various methods. For example, the contact areas and recesses of the modified surface can be produced using chemical methods, electrochemical methods, physical methods or combinations thereof. The aforementioned step either results in a deposition of material on the surface of the roller or the step results in an ablation of material. Preferably, physical methods like shape cutting processes or laser ablation are used to produce the inventive surface structure.

Furthermore, the recesses can be produced using etching processes, ablation processes, and combinations thereof. The person skilled in the art is aware of corresponding processes to be used in this context like cutting processes including milling using, for example a rotary mill, or laser ablation. Milling processes are beneficial as readily available equipment can be used. However, such processes typical provide sharp edges typically requiring a further process step to eliminate said sharp edges. Other processes like the laser ablation typically require less available and more expensive equipment. However, the edges of correspondingly produced indentations typically provide no sharp edges and require less to no post processing. Even small previous preparation steps to, for example, prevent a reflection of the laser from a metal surface typically require far less effort than rounding the edges of corresponding indentations with sharp edges.

Another possibility to produce the inventive modified surface utilizes galvanic or electroless chemical plating process. Herein, for example, the deposited material can be used as contact areas.

Furthermore, the modified surface can be manufactured using rapid prototyping. Examples of rapid prototyping are 3D printing of organic polymers using a type of printer or methods like selective laser melting, selective laser sintering or electron beam melting using a laser or an electron beam for melting especially metals.

Additionally, the recesses can be produced by scratching an essentially plain surface of a solid body roller to provide the modified surface. For example, such scratching of the surface might be accomplished using, for example, sandblasting, sandpaper or an additional roller containing abrasive particles like ceramic particles or industry diamonds, on its surface.

Herein, it is typically preferred that the inventive contact areas do not provide sharp edges. It appears that transport rollers providing such contact areas further reduce damages especially of very flexible substrates.

Sharp edges of the contact areas produced, for example, by the above referenced methods can be subsequently rounded using methods known to the person skilled in the art. For example, etching processes can be used for metal surfaces or melting processes for typical organic polymer surfaces.

Further types of transport rollers as used herein contain a core area and a coating thereon. Herein, it is typically preferred that the transport roller provides a core material providing a central part of the transport roller and a coating material providing the modified surface, wherein the core material and the coating material are different.

Furthermore, the transport rollers providing an essentially homogenous material for the modified surface provided better results on long term basis. However, using, for example, a metal surface or organic polymer surface, wherein, for example, the recesses are scratched into said surface or material is ablated using some different method typically provided a transport roller with a higher lifetime. Herein, the modified surface consists of an essentially homogenous material like a polymer or a metal, preferably a polymer. The material in such cases is especially not made from a fibrous material or foam. Preferably, the upper most 1 mm, more preferred the upper most 2 mm, of the material of the modified surface provides less than 1 vol.-%, preferably less than 0.5 vol.-%, of enclosed cavities in a cross section along the axis of the transport roller, wherein the distance is measured starting from the contact line. Such requirement also refers to a coating of the inventive transport roller providing the modified surface.

Different materials can be used to provide the inventive modified surface. For example, said material can be selected from the group consisting of metal, organic polymers or combinations thereof. Organic polymers proved to be especially useful for many applications, as they are typically easily modified and provide high chemical resistance.

Preferably, the transport rollers consist essentially, preferably to at least 90 wt.-%, more preferred to at least 95 wt.-%, even more preferred to at least 99 wt.-%, of metal, organic polymers or combinations thereof, based on the total weight of the transport roller. The total weight of the transport roller is based on the weight of the transport roller without reversibly attached parts. For example, parts of an axle bearing not firmly connected to the transport roller are not included when determining the total weight.

Examples of organic polymers that might be used for the inventive transport rollers and especially the surface adapted to contact the substance are polyethylene, polypropylene, PVDF (polyvinylidene fluoride), PVC (polyvinyl chloride); PEEK (Polyether ether ketone), EPDM rubber (ethylene propylene diene monomer rubber), mixtures thereof or combinations thereof. Typically, beneficially used organic polymers are polypropylene, polyethylene and EPDM, especially polypropylene and polyethylene. An example of a preferred mixture of said organic polymers is a copolymer of polyethylene and polyethylene. Providing combinations of the aforementioned organic polymers allows to, for example, provide different areas of the modified surface consisting of different polymer providing different features like different frictions.

For many applications it proved to be beneficial that the modified surface provides an organic polymer selected from polypropylene, polyethylene or mixtures thereof. Preferably, the modified surface consists of an organic polymer, wherein the organic polymer consists to at least 50 wt.-%, more preferred at least 80 wt.-%, even more preferred at least 99 wt.-%, of polypropylene, polyethylene or mixtures thereof, based on the total weight of the organic polymer excluding additives like lubricants, plasticizers, colorants or fillers. Preferably the aforementioned wt.-% refers to the total weight of the organic polymer including colorants and fillers, more preferred to the total weight of the organic polymer including the additives.

Furthermore, the present invention refers to a kit of transport rollers adapted to be used a pair of transport rollers arranged below and above the transport plane for retaining a liquid on one side of the transport roller pair.

Additionally, the present invention refers to a horizontal transport system containing transport rollers, wherein at least one transport rollers is an inventive transport roller.

Typically, it is preferred that at least 50% of the transport rollers of the horizontal transport system are inventive transport rollers. Especially, it is preferred that at least 50% of the transport rollers of the retaining roller pairs of the horizontal transport system are inventive transport rollers. High amounts of non-inventive transport rollers typically reduced the inventive benefits.

Furthermore, it was noted that the inventive transport rollers are preferably utilized as transport roller below the transport plane. Herein, at least two, more preferred at least five, inventive transport rollers are arranged below the transport plane.

Especially, it is preferred that the inventive transport rollers as used in retaining roller pairs included in the inventive horizontal transport system. For example, the horizontal transport system preferably contains at least two inventive transport rollers being arranged as retaining roller pair. Even more preferred the horizontal transport system contains at least two, more preferred at least four of such retaining roller pairs.

Furthermore, the present invention refers to a treatment device for electroless treatment or electroplating, wherein the treatment device contains at least one inventive transport roller or at least one inventive horizontal transport system.

Preferably, the treatment device is a horizontal treatment device for chemical etching, chemical cleaning, chemical metal deposition or electrolytic metal deposition, in particular chemical metal deposition or electrolytic metal deposition. For example, such treatment device can be used for the deposition of metals like as copper, tin, gold, silver or alloys thereof. Corresponding treatments represent very complex procedures including a high number of different steps including many pretreatment and post treatment steps arranged before, after and between the actual depositions and modification steps of the deposit. Examples of such pretreatment and post treatment steps are rinsing, drying and etching.

Herein, the inventive transport rollers are preferably placed at the beginning or the end of a wet treatment module of the treatment device. For example, the inventive transport rollers can be used as part of a drying module or as retaining roller pair to accumulate a treatment liquid in a part of the treatment device.

It is especially preferred that the treatment device contains at least two inventive transport rollers being arranged as retaining roller pair, and wherein the treatment device is adapted to back up a treatment liquid on a side of the retaining roller pair above the transport plane.

Furthermore, the present invention refers to a method for treating a substrate, wherein the method contains the step of transporting the substrate using an inventive transport roller, an inventive horizontal transport system or an inventive treatment device.

Furthermore, the present invention refers to a use of an inventive transport roller for horizontally transporting a substrate.

FIG. 1 shows a schematic side view of an inventive transport roller 1 according to a preferred embodiment of the present invention. Herein, the transport roller 1 contains a modified surface 4 consisting of an essentially homogenous material arranged around the transport roller 1. Herein, the material of the modified surface 4 is polypropylene. The modified surface 4 is adapted to provide a non-uniform contacting of the substrate, wherein said modified surface 4 contains contact areas 5 adapted to contact the substrate and non-contacting areas of the transport roller 1 in form of recesses 6 between the contact areas 5. While the transport roller 1 essentially provides the form of a solid body roller it simultaneously provides a possible liquid or gas exchange on both sides of the transport roller. At both ends of the transport roller a surface 7 not adapted to contact the substrate is located, wherein said surface is not modified.

Enclosed between the contact line and the recesses 6 of the modified surface 4 an area is enclosed by each recess being at most 5 mm$^2$ in a cross section along the axis of the transport roller 1. Herein, the sum of the areas of said recesses is less than 30 mm$^2$ for the transport roller 1 providing a length of the modified surface 4 being 150 cm. Said recesses 6 provide the shape of lines circling around the transport roller 1, wherein said line shaped recesses are essentially perpendicular to the contact lines. Said line shaped recesses 6 provide a length measured along the contact line being around 0.2 mm and are arranged to provide a length of the contact areas 5 measured along a contact line being around 0.8 mm.

Figure 2:
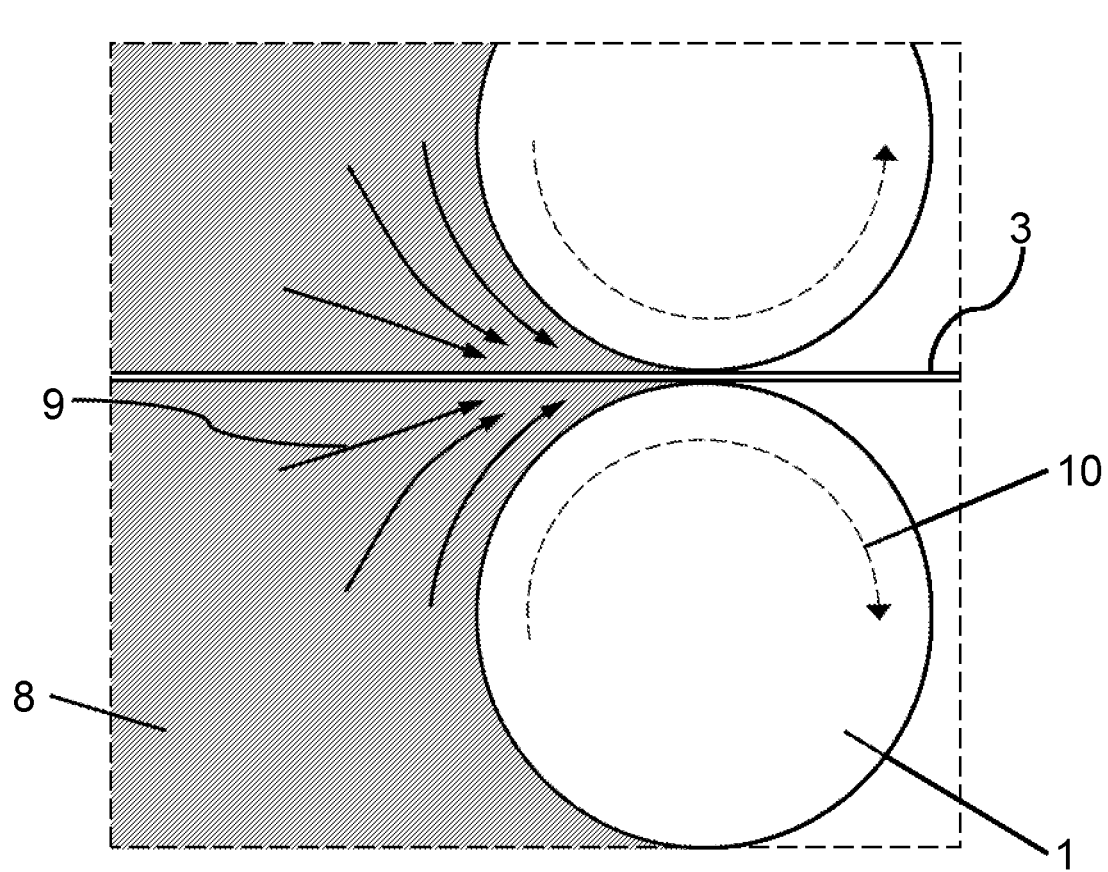
FIG. 2 shows a cut out of a schematic cross section of an inventive horizontal transport system containing a transport roller as shown in FIG. 1.

FIG. 2 shows a cut out of a schematic cross section of an inventive horizontal transport system containing a transport roller 1 as shown in FIG. 1. Herein, a retaining roller pair containing an inventive transport roller 1 is used to forward a substrate.

The lower transport roller 1 rotates in a clockwise direction 10 to forward the substrate 3 in transport direction. Simultaneously, the treatment liquid 8 is set into movement, wherein the direction of movement 9 is directed towards the top of said transport roller 1. The upper transport roller 1 rotates in an anticlockwise direction and provides an analog movement of the treatment liquid 8.

Figure 3:
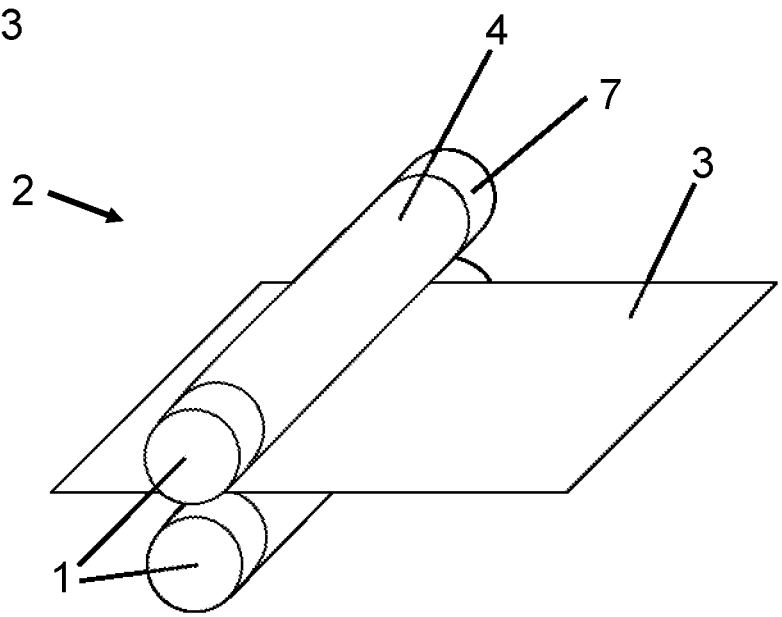
FIG. 3 shows a schematic perspective side view of a part of an inventive horizontal transport system containing a transport roller as shown in FIG. 1.

FIG. 3 shows a schematic side view of a part of a horizontal transport system containing a transport roller as shown in FIG. 1. Herein, two transport rollers 1 according to FIG. 1 are used as retaining roller pair. The modified surface 4 of the transport rollers 1 contacts the substrate 3, wherein the rotation of said transport rollers 1 forwards said substrate 3. The arrangement of the two transport rollers 1 as retaining roller pair allows transporting the substrate 3 while retaining a treatment liquid on one side or both sides of the retaining roller pair. Such arrangement can further be used to remove liquid from the surface of substrate 3 in a dry module.

Figure 4:
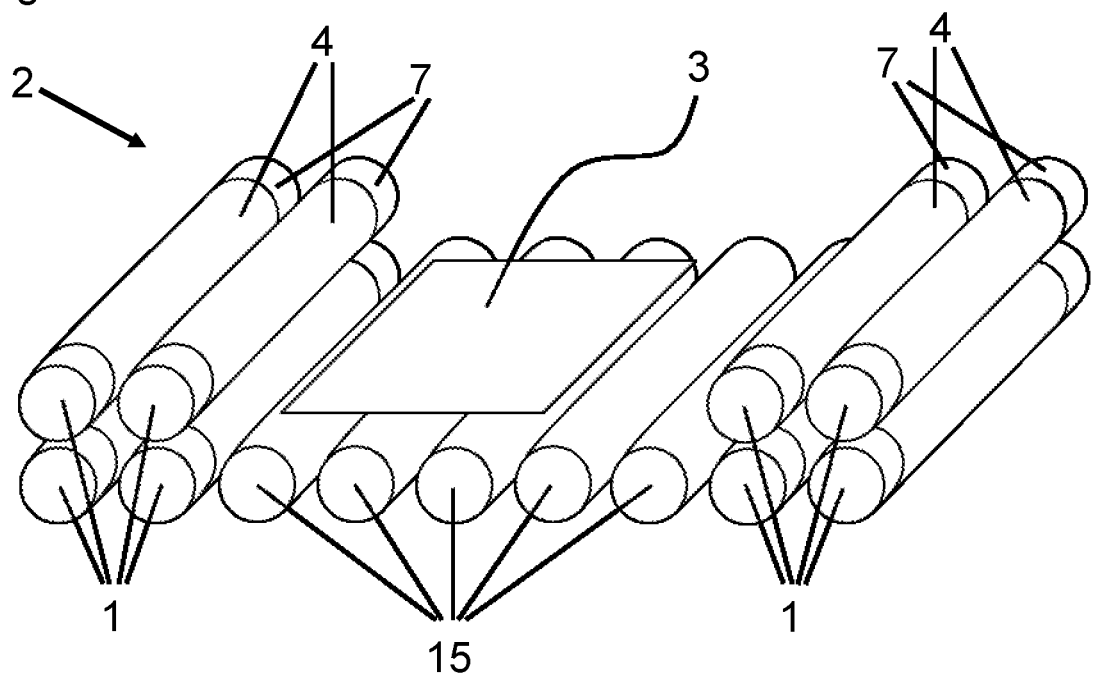
FIG. 4 shows a schematic perspective side view of a part of an inventive horizontal transport system containing a transport roller as shown in FIG. 1.

FIG. 4 shows a schematic side view of a part of a horizontal transport system 2 containing a transport roller as shown in FIG. 1. Herein, the part of the horizontal transport system 2 contains eight transport rollers 1 as shown in FIG. 1 providing a modified surface 4 and a surface 7 being not modified. These transport rollers 1 are arranged to provide four retaining roller pairs. Between these retaining roller pairs five transport rollers 15 without the inventive modified surface are arranged.

Figure 5:
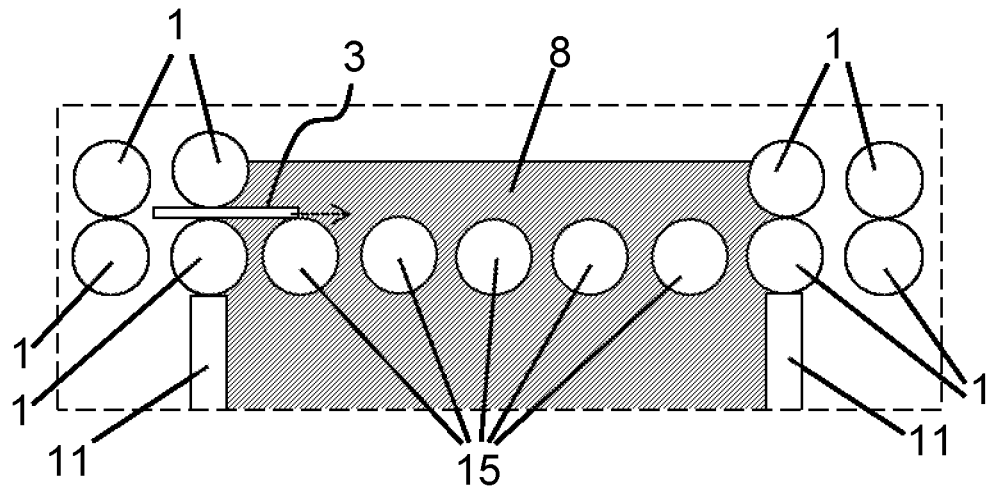
FIG. 5 shows a schematic cross section of a part an inventive treatment device containing the part of the horizontal transport system as shown in FIG. 4.

FIG. 5 shows a schematic cross section of a part an inventive treatment device containing the part of the horizontal transport system as shown in FIG. 4. Herein, one retaining roller pair containing two inventive transport rollers 1 is arranged at the beginning and at the end of a treatment bath. These retaining roller pairs together with a respective weir 11 to accumulate treatment liquid 8, so that the substrate 3 can be transported below the bath level. The additional retaining roller pairs each containing two transport rollers 1 ensure to further remove liquid from the surface of the substrate before entering the treatment bath and after having left it.

Figure 6A:
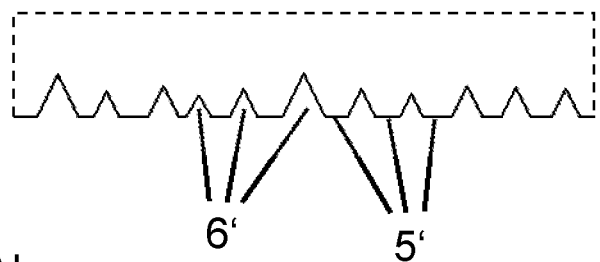
FIGS. 6a, 6b and 6c show cut outs of schematic cross sections of the modified surface of different types of inventive transport rollers comparable to the transport roller shown in FIG. 1.
Figure 6B:
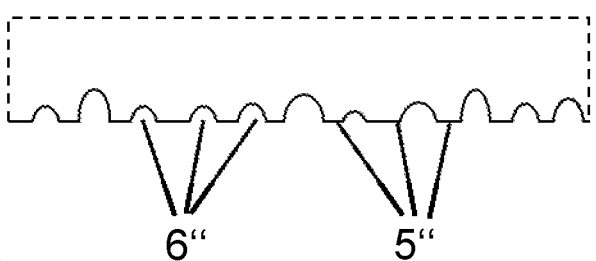
Figure 6C:
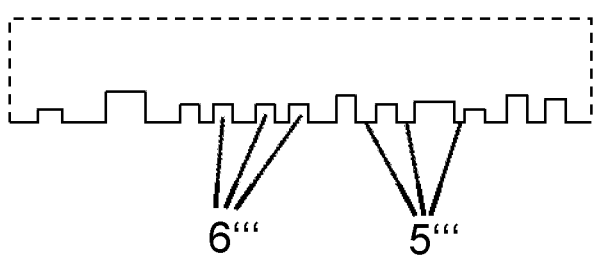

FIGS. 6a, 6b and 6c show cut outs of schematic cross sections of the modified surface of different types of inventive transport rollers comparable to the transport roller shown in FIG. 1. Herein, different types of recesses 6', 6", 6''' are provided. FIG. 6a shows multiple triangular recesses 6' of irregular size. FIG. 6b shows rounded recesses 6" of irregular size. FIG. 6c shows rectangular recesses 6''' of irregular size. These recesses 6', 6''' are located between the contact areas 5', 5'', 5'''.

Figure 7A:
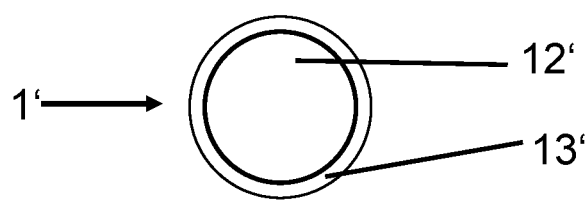
FIGS. 7a, 7b and 7c show schematic cross sections and a schematic side view of an inventive transport roller 1' providing a central part 12 and a coating material 13.
Figure 7B:
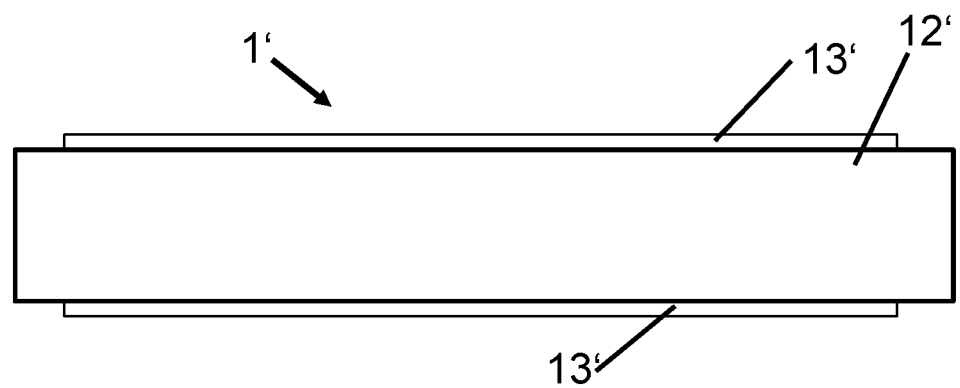
Figure 7C:
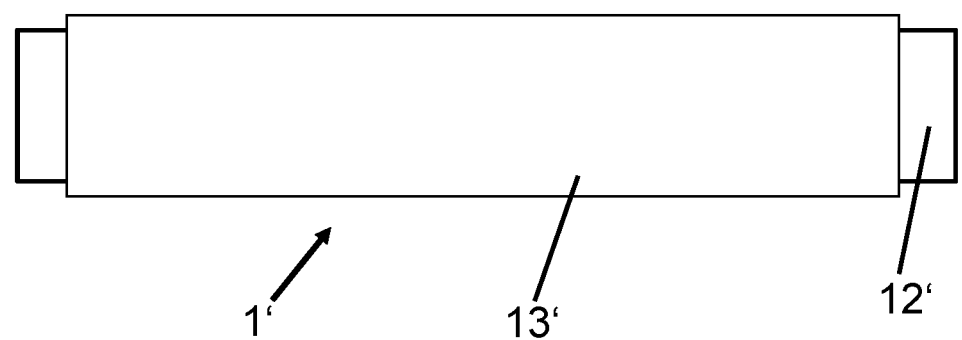

FIGS. 7a, 7b and 7c show schematic cross sections and a schematic side view of a transport roller 1' providing a central part 12 and a coating material 13. Herein, the transport roller 1' contains a coating consisting of an organic polymer providing a modified surface arranged around the transport roller. The modified surface is adapted to provide a non-uniform contacting of the substrate, wherein said modified surface contains contact areas adapted to contact the substrate and recesses between the contact areas. While the transport roller essentially provides the form of a solid body roller it simultaneously provides the possibility to exchange liquids or gases on both sides of the transport roller based on the recesses resulting from the modified surface provided by the coating.

Figure 8:
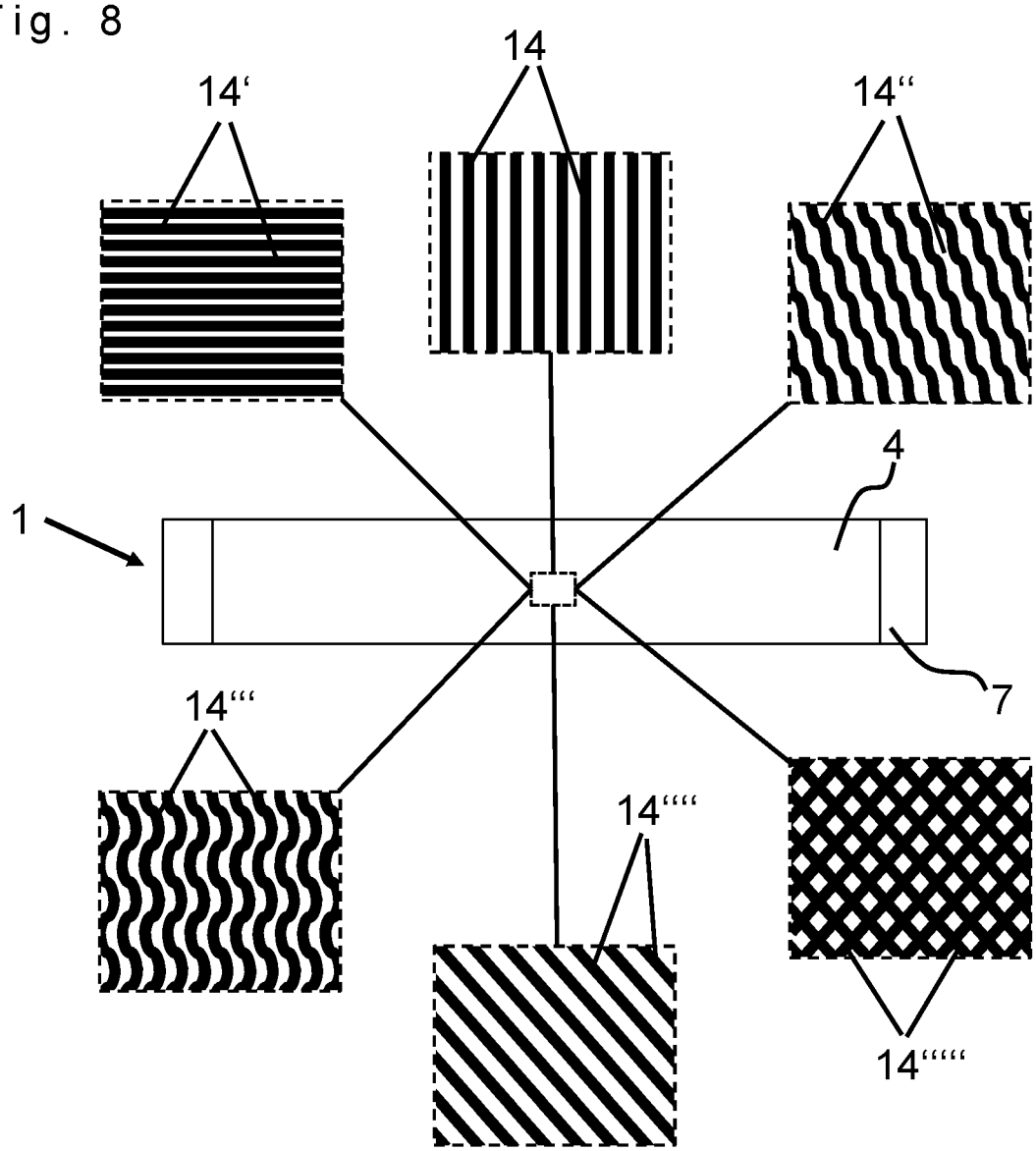
FIG. 8 shows a schematic side view of different types of line shaped recesses of preferred embodiments of the present invention.

FIG. 8 shows a schematic side view of different types of line shaped recesses 14, 14', 14'', 14''', 14'''', 14''''' of preferred embodiments of the present invention. Herein, FIG. 8 shows line shaped recesses 14 as shown in FIG. 1, as well as four different examples of line shaped recesses 14'', 14''', 14'''', 14''''' circling the transport roller 1. Furthermore, FIG. 8 shows line shaped recesses 14', wherein said lines do not circle the transport roller 1, but are essentially parallel to the axis of the transport roller 1. The four examples of the line shaped recesses 14'', 14''', 14'''', 14''''' not shown in FIG. 1 and providing lines circling the transport roller are applied onto transport rollers 1 analog to FIG. 1. The line shaped recesses 14' being essentially parallel to the axis of the transport roller are applied to an transport roller analog to FIG. 1, wherein line shaped recesses 14' are further characterized in that they provide areas enclosed between the recesses and a contact circle, wherein said areas are at most 12 mm² in a cross section perpendicular to the axis of the transport roller 1.

REFERENCE SIGNS 1, 1': transport roller
2: horizontal transport system
3: substrate
4: modified surface
5, 5', 5'', 5''': contact area
6, 6', 6'', 6''': recess
7: surface not adapted to contact the substrate
8: treatment liquid
9: movement of the treatment liquid
10: movement direction of the transport roller
11: weir
12: central part of the transport roller
13: coating material
14, 14', 14'', 14''', 14'''', 14''''': line shaped recess
15: transport rollers without modified surface

The invention claimed is:

1. A transport roller for a horizontal transport system for transporting a substrate, wherein the transport roller essentially has the form of a solid body roller characterized in that
the transport roller further contains a modified surface and provides non-uniform contacting of the substrate,
wherein the modified surface contains contact areas for contacting the substrate and recesses between the contact areas not contacting the substrate,
wherein the modified surface is adapted to provide a liquid or gas exchange on both sides of the transport roller while being transported using the transport roller;
wherein the modified surface consists of an essentially homogenous material, wherein said homogenous material is not made from a fibrous material or a foam, and
wherein each recess provides a surface and an area is enclosed between the surface of each recess and a contact line or a contact circle in a cross section, and wherein the areas in a cross section along the axis of the transport roller are at most 5 mm², the areas in a cross section perpendicular to an axis of the transport roller are at most 12 mm², or both, and add up to at least 90% of the sum of all areas of the recesses in the corresponding cross section.

2. The transport roller according to claim 1, wherein the modified surface provides line shaped recesses.

3. The transport roller according to claim 1, wherein at least 90% of the contact areas of the modified surface have a length of at most 1.3 cm in a cross section along the axis of the transport roller; a length of at most 0.8 cm in a cross section perpendicular to an axis of the transport roller or both, based on the number of the contact areas in the corresponding cross section.

4. The transport roller according to claim 1, wherein the modified surface contains at least one contact area each centimeter along the contact line, each centimeter along the contact circle, or both.

5. The transport roller according to claim 1, wherein neighboring contact areas have a distance of at most 7 mm, and
wherein neighboring recesses have a distance of at most 6 mm.

6. Horizontal transport system containing transport rollers, wherein at least one transport roller is a transport roller according to claim 1.

7. Horizontal transport system according to claim 6, wherein the transport system comprises at least two said transport rollers arranged as retaining roller pair.

8. Treatment device for wet treatment, wherein the treatment device contains at least one horizontal transport system according to claim 6.

9. Method for treating a substrate, wherein the method contains the step of transporting the substrate using a horizontal transport system according to claim 6.

10. Treatment device for wet treatment, wherein the treatment device contains at least one transport roller according to claim 1.

11. Method for treating a substrate, wherein the method contains the step of transporting the substrate using a treatment device according to claim 10.

12. Method for treating a substrate, wherein the method contains the step of transporting the substrate using a transport roller according to claim 1.

13. A transport roller according to claim 1, wherein said homogenous material is a polymer or a metal.

14. A transport roller for a horizontal transport system for transporting a substrate, wherein the transport roller essentially has the form of a solid body roller characterized in that
the transport roller further contains a modified surface and provides non-uniform contacting of the substrate,
wherein the modified surface contains contact areas for contacting the substrate and recesses between the contact areas not contacting the substrate, and
wherein the modified surface is adapted to provide a liquid or gas exchange on both sides of the transport roller while being transported using the transport roller;
wherein the modified surface consists of an essentially homogenous material, wherein said homogenous material is not made from a fibrous material or a foam, and wherein the modified surface provides a contact line, each recess provides a surface and an area is enclosed between the surface of each recess and the contact line in a cross section along an axis of the transport roller, wherein said areas add together to at most 40 mm$^2$ per meter length, based on the length of the contact line.

15. Horizontal transport system containing transport rollers, wherein at least one transport roller is a transport roller according to claim 14.

16. Treatment device for wet treatment, wherein the treatment device contains at least one horizontal transport system according to claim 15.

17. Method for treating a substrate, wherein the method contains the step of transporting the substrate using a transport roller according to claim 14.

18. A transport roller for a horizontal transport system for transporting a substrate, wherein the transport roller essentially has the form of a solid body roller characterized in that
the transport roller further contains a modified surface and provides non-uniform contacting of the substrate,
wherein the modified surface contains contact areas for contacting the substrate and recesses between the contact areas not contacting the substrate, and
wherein the modified surface is adapted to provide a liquid or gas exchange on both sides of the transport roller while being transported using the transport roller; wherein the modified surface consists of an essentially homogenous material, wherein said homogenous material is not made from a fibrous material or a foam, and
wherein any contact point of the contact areas provides a distance to the next recess being at most 0.8 cm.

19. Horizontal transport system containing transport rollers, wherein at least one transport roller is a transport roller according to claim 18.

20. Treatment device for wet treatment, wherein the treatment device contains at least one horizontal transport system according to claim 19.

21. Method for treating a substrate, wherein the method contains the step of transporting the substrate using a transport roller according to claim 18.

* * * * *